(12) United States Patent
Wu et al.

(10) Patent No.: US 7,368,950 B2
(45) Date of Patent: May 6, 2008

(54) HIGH SPEED TRANSCEIVER WITH LOW POWER CONSUMPTION

(75) Inventors: Larry Wu, Shanghai (CN); Howard Yang, Shanghai (CN); Zhen-Dong Guo, Shanghai (CN)

(73) Assignee: Montage Technology Group Limited, George Town, Grand Cayman (KY)

( * ) Notice: Subject to any disclaimer, the term of this patent is extended or adjusted under 35 U.S.C. 154(b) by 112 days.

(21) Appl. No.: 11/281,211

(22) Filed: Nov. 16, 2005

(65) Prior Publication Data
US 2007/0109019 A1    May 17, 2007

(51) Int. Cl.
H03K 19/094    (2006.01)
H03K 19/0175    (2006.01)

(52) U.S. Cl. ............ 326/83; 326/68; 326/86; 341/144

(58) Field of Classification Search ........ 326/31, 326/32, 33, 82, 83, 86, 95, 96, 98, 68, 38, 326/115; 341/144
See application file for complete search history.

(56) References Cited

U.S. PATENT DOCUMENTS

| | | | | |
|---|---|---|---|---|
| 5,977,819 A | * | 11/1999 | Sanwo et al. | 327/563 |
| 5,990,722 A | * | 11/1999 | Jaffard et al. | 327/309 |
| 6,034,562 A | * | 3/2000 | Bonet et al. | 327/541 |
| 6,157,231 A | * | 12/2000 | Wasson | 327/156 |
| 6,518,906 B2 | * | 2/2003 | Abel et al. | 341/144 |
| 7,145,359 B2 | * | 12/2006 | Hein et al. | 326/38 |
| 7,180,332 B2 | * | 2/2007 | Di Gregorio | 326/96 |

OTHER PUBLICATIONS

Jaeha Kim and Mark A. Horowitz, "Adaptive Supply Serial Links with Sub-1V Operation and Per-Pin Clock Recovery", IEEE International Solid-State Circuits Conference, vol. XLV, pp. 268-269, Feb. 2002.

Stefanos Sidiropoulos and Mark A Horowitz, "A Semidigital Dual Delay-Locked Loop", IEEE Journal of Solid-State Circuits, vol. 32, pp. 1683-1692, Nov. 1997.

Alan Fiedler, Ross Mactaggart, James Welch and Shoba Krishnan, "A 1.0625Gbps Transceiver with 2x-Oversampling and Transmit Signal Pre-Emphasis", IEEE International Solid-State Circuits Conference, vol. XL, pp. 238-239, Feb. 1997.

Jiren Yuan and Christer Svensson, "New Single-Clock CMOS Latches and Flipflops with Improved Speed and Power Savings", IEEE Journal of Solid-State Circuits, vol. 32, pp. 62-69, Jan. 1997.

M. Rau, T. Oberst, et al., "Clock/Data Recovery PLL Using Half-Frequency Clock", IEEE Journal of Solid-State Circuits, vol. 32, pp. 1156-1159, Jul. 1997.

* cited by examiner

*Primary Examiner*—Rexford Barnie
*Assistant Examiner*—Crystal L Hammond
(74) *Attorney, Agent, or Firm*—Ivy Y Mei

(57) ABSTRACT

High-speed and low-power consumption CMOS receivers using adaptively-regulated power supply and pseudo differential digital logic to: 1) reduce the power consumption of the transceiver; and, 2) increase the power supply rejection (PSR) during processing the data.

20 Claims, 7 Drawing Sheets

(a)

(b)

(a)

(b)

HIGH SPEED TRANSCEIVER WITH LOW POWER CONSUMPTION

FIELD OF THE TECHNOLOGY

At least some embodiments of the invention relate to transceivers in general, and more specifically to high-speed and low-power consumption transceivers implemented on an integrated circuit chip.

BACKGROUND

To increase the performance of the dynamic random access memory (DRAM) system of a computer system, the technology of Fully Buffered Dual In-line Memory Module (FB-DIMM) has been developed.

FB-DIMM technology uses point-to-point connections between memory modules. For example, the host memory controller is connected to a first memory module; and a first memory module is connected to a second memory module; etc. Thus, the load of each link is constant. No branch is needed in this type of point-to-point connection. The memory modules operate at a substantially constant load environment regardless of the number of memory modules used in the system.

Advanced Memory Buffer (AMB) is a portion of a FB-DIMM which provides the point-to-point link in the memory system. An AMB typically includes two serial ports and a parallel port. One of the serial port is for connecting to the host memory controller or the AMB of the adjacent memory module that is closer to the host memory controller; the other serial port is for connecting to the AMB of the adjacent memory module that is further away from the host memory controller; and the parallel port is for connecting to the bus to the memory chips that are on the same memory module as the AMB.

For example, serial data from the host memory controller sent through a downstream serial link to the AMB is temporarily buffered in the AMB before being sent to the DRAM chips on the memory module. The serial data contains the address, data and command information, which is converted in the AMB and placed onto the DRAM bus on the memory module. The AMB writes in and reads out from DRAM chips as instructed by the memory controller. The data retrieved from the DRAM is converted to serial data in the AMB and sent to the memory controller through an upstream serial link.

High-speed transceivers play an important role in data communications, such as in the AMB. A typical data transceiver structure for the AMB includes a multiplexer (MUX) for time multiplexing data received from a parallel port into a serial form, a pre-driver and an output driver coupled to the multiplexer to drive the data in the serial form over a serial port. The typical data transceiver structure for the AMB further includes a clock recovery (CR) circuitry and a data recovery (DR) circuitry to recover clock and data signals from a serial port and a de-multiplexer (DEMUX) for converting the serial data into the parallel form for transmission over a parallel port.

Traditionally, a high performance transceiver is implemented using current mode logic (CML) circuits. A current mode logic circuit amplifies a differential input through switching a current between two paths. CML circuits are typically implemented using MOS transistors.

A conventional transceiver implemented using the CML technique uses a substantially constant power supply current, since the substantially same constant current is switched between the two paths regardless of the working frequency, data transition pattern, fabrication process and working temperature variations. While the use of constant power supply current reduces the power supply noise, a huge amount of power is wasted during the normal operation of the transceiver.

SUMMARY OF THE DESCRIPTION

High-speed and low-power consumption signal transceivers implemented using pseudo-differential digital logic are described herein. In one embodiment, the receiver further uses an adaptive power-supply regulator.

In one embodiment, a signal transceiver includes a pseudo differential digital logic circuit to convert an input to the receiver into a differential digital output. The input may be a single-ended input or a differential input. In one example, the pseudo differential digital logic circuit is implemented using Complementary Metal-Oxide Semiconductor (CMOS).

In one embodiment, the power consumed by the pseudo differential digital logic circuit is substantially linear with respect to an operating frequency of the pseudo differential digital logic circuit.

In one embodiment, the power consumed by the pseudo differential digital logic circuit is substantially a square function of a voltage supply of the pseudo differential digital logic circuit.

In one embodiment, the signal transceiver includes: an adaptive power-supply regulator coupled with the pseudo differential digital logic circuit to adaptively adjust a power supply of the pseudo differential digital logic circuit. In one example, the power supply of the pseudo differential digital logic circuit is adjusted according to one of: an operating frequency of the pseudo differential digital logic circuit; a data transition pattern of the input; fabrication process; and operating temperature variation.

In one embodiment, an operating frequency of the adaptive power-supply regulator is to track an operating frequency of the pseudo differential digital logic circuit.

In one embodiment, the signal transceiver is capable of receiving data at a speed higher than one Gigabit per second.

In one embodiment, the pseudo differential digital logic circuit includes: two logic units each of which is one of: a buffer and an inverter; and a common mode feedback (CMFB) circuit coupled to the two logic units, where the CMFB circuit is to receive outputs of the two logic units and adjust the two logic units according to a common mode detected from the outputs of the two logic units.

In one embodiment, the pseudo differential digital logic circuit includes: two logic units each of which is one of: a buffer and an inverter; and a cross couple circuit coupled to the two logic units, the cross couple circuit to cross couple outputs of the two logic units to maintain opposite polarity in the outputs of the two logic units. In one example, the cross couple circuit comprises a first inverter connecting the outputs of the two logic units in a first direction and a second inverter connecting the outputs of the two logic units in a second direction that is opposite to the first direction.

In one embodiment, the pseudo differential digital logic circuit includes: two logic units each of which is one of: a buffer and an inverter; and a clock synchronization circuit coupled to the two logic units to synchronize timing of outputs of the two logic units.

In one embodiment, the signal transceiver further includes: a de-multiplexer coupled with the pseudo differential digital logic circuit to generate parallel output data according to data time multiplexed in the input.

In one embodiment, an advanced memory buffer (AMB) includes a first port to a serial data link; a second port to a parallel data link; a transceiver according to embodiments of the invention coupled with the first port and the second port.

In one embodiment, the advanced memory buffer is implemented on a single chip having a feature size less than 0.18 micron; the pseudo differential digital logic circuit is capable to receive data at a speed higher than one Gigabit per second.

Embodiments of the invention further include memory modules using the advanced memory buffer according to embodiment of the invention and a computer system that uses the transceiver according to embodiments of the invention for various high-speed links.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

DETAILED DESCRIPTION

The following description and drawings are illustrative of the invention and are not to be construed as limiting the invention. Numerous specific details are described to provide a thorough understanding of the present invention. However, in certain instances, well-known or conventional details are not described in order to avoid obscuring the description of the present invention. References to one or an embodiment in the present disclosure are not necessarily references to the same embodiment; and, such references mean at least one.

The increasing demand of data transporting rate leads to the requirement of high frequency bandwidth and large number of I/Os on the same system. Consequently, the power consumption and thus the temperature of a data transceiver device can become considerably high in high-speed digital communication applications.

For example, in the Advanced Memory Buffer (AMB) of a Fully Buffered-Dual-in-line Memory Module (FB-DIMM), the operating temperature of the system can become critical, since there is no space between modules for bulky heat sinks. As twenty-four lines of high-speed Serializer/Deserializer (SERDES) and a large number of I/Os are integrated into an AMB, the operating temperature of the chip may become unbearably high. Thus, it may be necessary to limit the power consumption of the AMB.

At least one embodiment of the invention significantly reduces the power consumption of a high-speed transceiver device by using adaptive power-supply regulation and CMOS Pseudo Differential Logic (PDL). When such a transceiver is used in the AMB, the power consumption of the AMB can be reduced to meet the thermal requirement.

Figure 1:
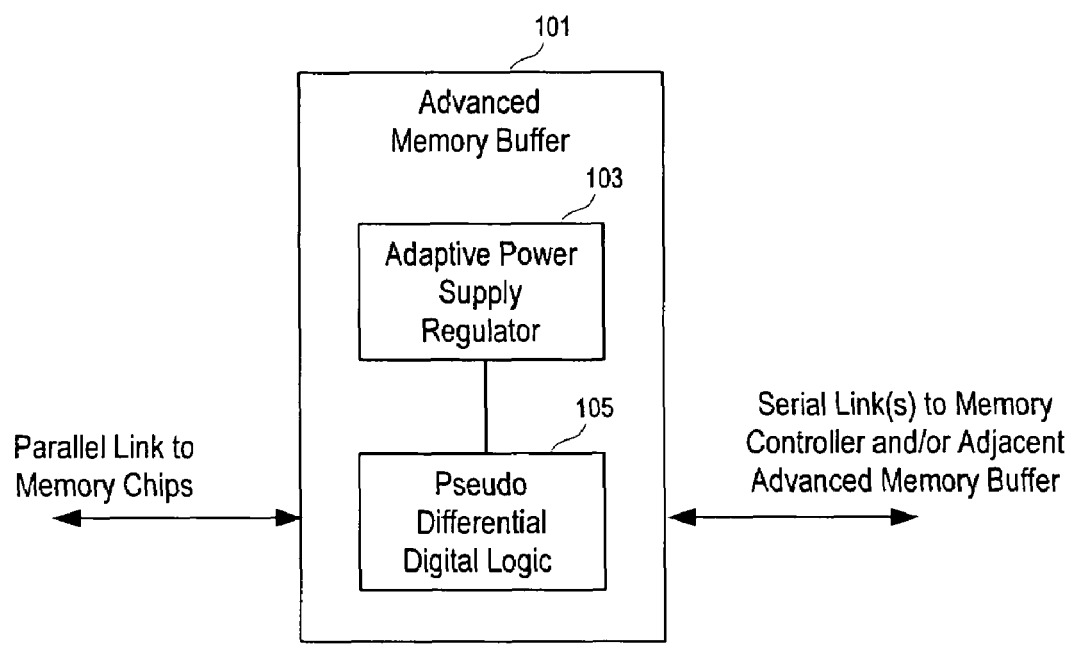
FIG. 1 shows the transceiver architecture according to one embodiment of the invention.

FIG. 1 shows the transceiver architecture according to one embodiment of the invention. In FIG. 1, an advanced memory buffer (AMB) (101) includes pseudo differential digital logic (105) that is used to implement a receiver and an adaptive power supply regulator (103) that is coupled to the pseudo differential digital logic to adaptively adjust the voltage supply to reduce power consumption and improve power supply noise performance.

In one embodiment of the invention, the pseudo differential digital logic is used at least in the receiving portion of the advance memory buffer for the serial link(s) to memory controller and/or adjacent advanced memory buffer.

In one embodiment of the invention, the pseudo differential digital logic is further used in the receiving portion of the advance memory buffer for the parallel link to memory chips.

One embodiment of the invention seeks to use CMOS based pseudo differential logic to implement a high-speed data transceiver, which can be used in an Advanced Memory Buffer (AMB). In order to further reduce the power consumption of the transceiver, one embodiment of the invention further uses an adaptive power-supply regulator to adaptively adjust the power supply to the transceiver according to the working frequency, data transition pattern, fabrication process and working temperature variations.

When the feature size of an integrated circuit is 0.18 um or larger, the power supply requirement of CMOS transistors is relatively high while the operating frequency of CMOS transistors is relatively low, in comparison with MOS transistors that are used to implement CML circuit. Thus, in such integrated circuits, a data transceiver using CML circuits can actually operate in relative high speed due to the low output voltage swing of CML circuits. Meanwhile, CML also produces less power-supply noise since it generates less current spikes related to the use of a near constant power supply current.

However, with reduced channel length of CMOS transistors, for example, 0.13 um or beyond, CML loses its advantage over CMOS logic in speed because the transconductance of the MOS transistors increases only slightly and eventually saturates with channel length reduction. Although increasing the power of CML circuits considerably can increase the data transceiver's operating speed/frequency, such an approach can lead to high power consumption in the transceiver. Thus, CML may not be suitable for use in high speed/frequency applications that require lower power consumption, such as in AMB.

CMOS digital logic is preferred when the feature size of CMOS is reduced to 0.13 um or smaller. However, traditional CMOS logic circuit technique has the disadvantage of generating rather large current spikes, thus, high power-supply noises.

One embodiment of the invention implements CMOS pseudo differential logic circuits in the design of high-speed/frequency data transceivers, which increases the power-supply noises immunity of the transceiver while keeping the low-power advantage of CMOS logic circuits. CMOS logic circuits consume little power when not changing states; and the pseudo differential design of the logic circuit reduces the current spikes.

In one embodiment of the invention, an adaptive power-supply regulator is further used to reduce power consumption of the transceiver as well as to reduce the power-supply noises.

In one embodiment of the invention, the CMOS based transceiver is used for high-speed data transportation, such as in advanced memory buffer (AMB), in which the data transmission speed can be above one Gigabit per second. In addition to AMB, high-speed and low-power consumption transceivers according to embodiments of the invention can also be used in fiber channel, digital display, network router and storage channel, etc.

In one embodiment of the invention, a transceiver has substantially the same functional structure as the conventional transceiver, such as multiplexer, pre-driver, driver, data recovery, clock recovery, de-multiplexer, etc.

However, in one embodiment of the invention, at least a portion of the MOS CML circuits used in the convectional transceiver is replaced with CMOS pseudo-different digital logic circuits. In one embodiment, the output driver is still implemented using the CML circuit due to system requirement. In one embodiment, only the output driver of the transceiver uses a MOS CML circuit.

Figure 2:
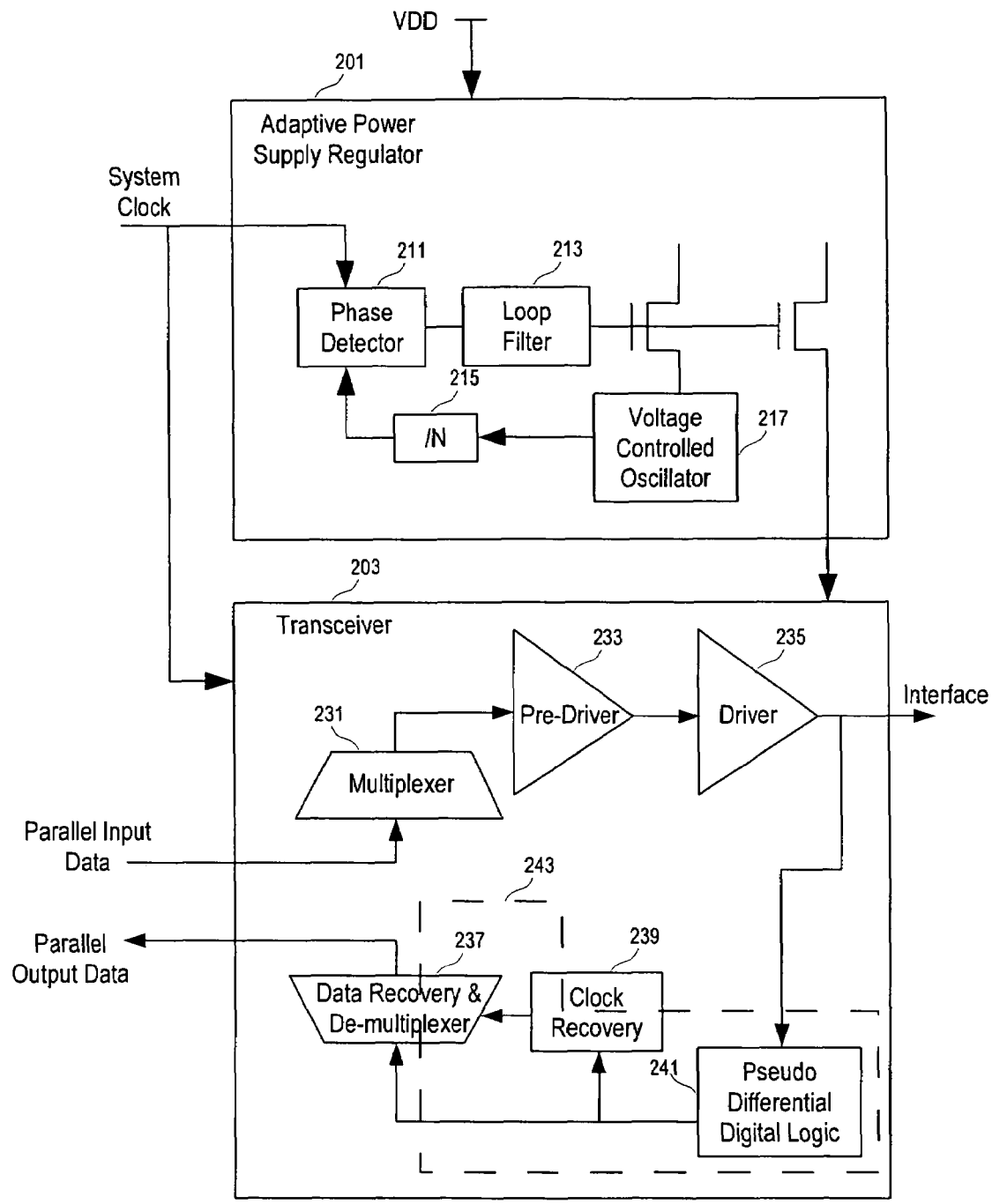
FIG. 2 shows a block diagram example of a transceiver according to one embodiment of the invention.

FIG. 2 shows a block diagram example of a transceiver according to one embodiment of the invention. In FIG. 2, the adaptive power supply regulator (201) provides the voltage supply to the transceiver (203), which includes a multiplexer (231) to receive parallel input data, a pre-driver (233), a driver (235) of the interface, a pseudo differential digital logic circuit (241) to receive from the interface, a clock recovery (239), and data recovery & de-multiplexer (237) to send out parallel output data.

In an alternative embodiment of the invention, the adaptive power supply regulator does not control the power supply of the drive (235).

The pseudo differential digital logic circuit (241) may cover more or less portions of the transceiver. For example, the pseudo differential digital logic circuit may be expanded to region (243) to implement a portion of the clock recovery (239) and a portion of data recovery & de-multiplexer (237). In one embodiment, the pseudo differential digital logic circuit may be further used in multiplexer (231) and/or the pre-driver (233).

Pseudo differential digital logic use two digital signal paths, which are complimentary, and a digital circuit (e.g., a latch) that is coupled in between the two digital signal paths to ensure that the output of the digital signal paths really have opposite polarity.

FIGS. 3-6 illustrate examples of a pseudo differential digital logic circuit which can be used in transceivers according to one embodiment of the invention.

Figure 3:
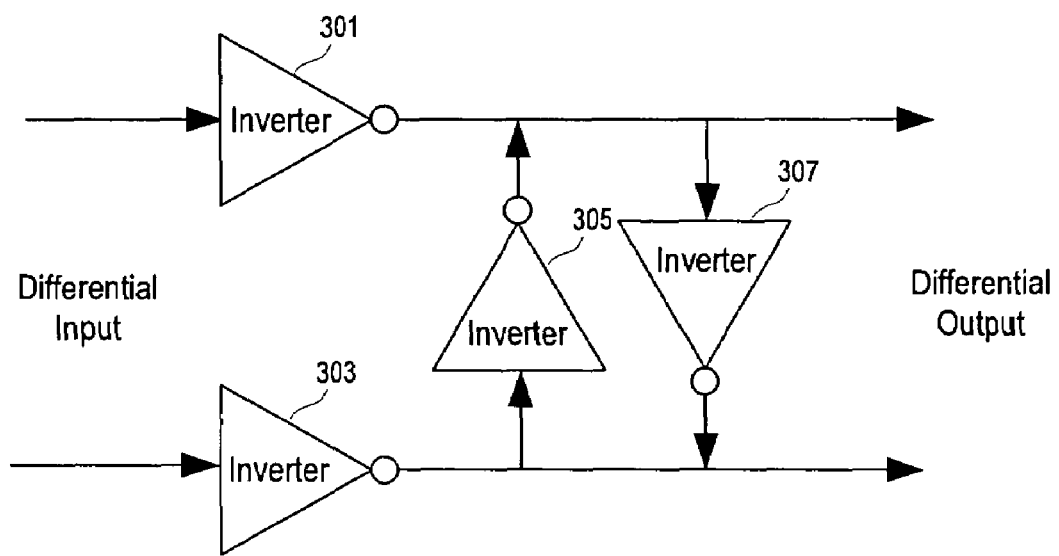
FIGS. 3-6 illustrate examples of a pseudo differential digital logic circuit which can be used in transceivers according to one embodiment of the invention.

In FIG. 3, a differential input is converted into digital signals along two paths by inverters (301 and 303). Two inverters (305 and 307) bridges between the outputs of the inverters (301 and 303) in opposite directions to ensure that the output of the inverters (301 and 303) really have opposite polarity for the differential output.

Figure 4:
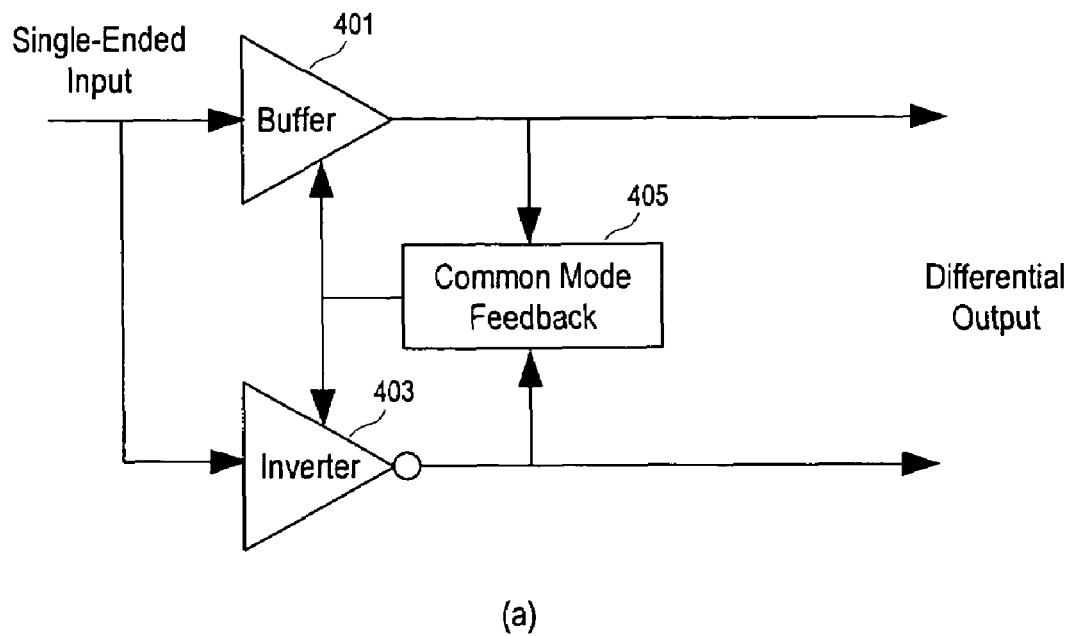
Figure 4:
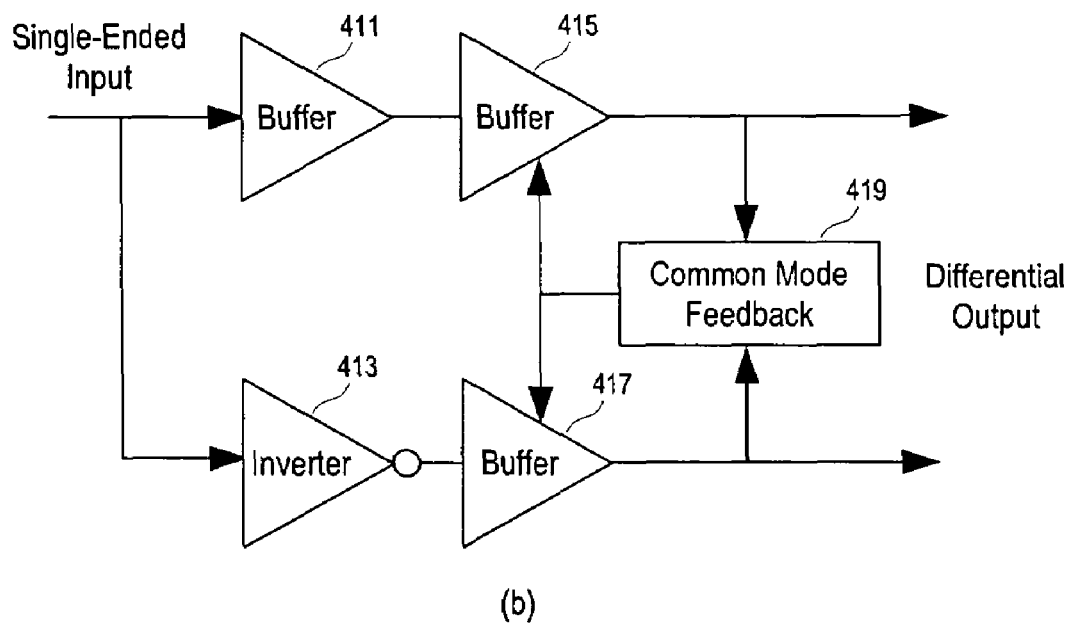

In FIG. 4(a), the pseudo differential digital logic includes a buffer (401) and an inverter (403) to convert a single-ended input into a pair of digital outputs along two paths. A common mode feedback logic block (405) is used to take the output of the buffer (401) and the output of the inverter (403), generate a feedback to the buffer (401) and the inverter (403) according to the common mode detected in the outputs, and use the feedback to adjust the buffer (401) and the inverter (403) to reach a target common mode in the differential output. Thus, the differential output of opposite polarity is generated. For example, the target common mode in the differential output can be designed to be half of the voltage of the power supply. When the common mode detected in the output is different from the target common mode, the common-mode feedback logic block (405) amplifies the error and provides feedback to the buffer (401) and the inverter (403) to reduce, minimize and/or eliminate the difference between the detected common mode and the target common mode. The differential output can be further elevated in magnitude using a pair of buffers or inverters (not shown in FIG. 4) along the two paths.

In FIG. 4(b), the pseudo differential digital logic includes: i) two buffers (411 and 415) to generate a digital output along one path; and, ii) an inventor (413) and a buffer (417) to generate another digital output along another path. A common mode feedback (CMFB) logic block (419) is coupled to the output of the two paths and the control of the buffers (415 and 417) to drive the common mode in the differential output to a target common mode in a way similar as the common mode feedback (CMFB) logic block (405) in FIG. 4(a).

Alternatively, the CMFB block (419) may control the buffer (411) and the inverter (413) to drive the common mode in the differential output to the target common mode.

In FIG. 4(b), the buffer (417) follows the inverter (413) on the path. Alternatively, a buffer may be placed before an inverter on the path.

Figure 5:
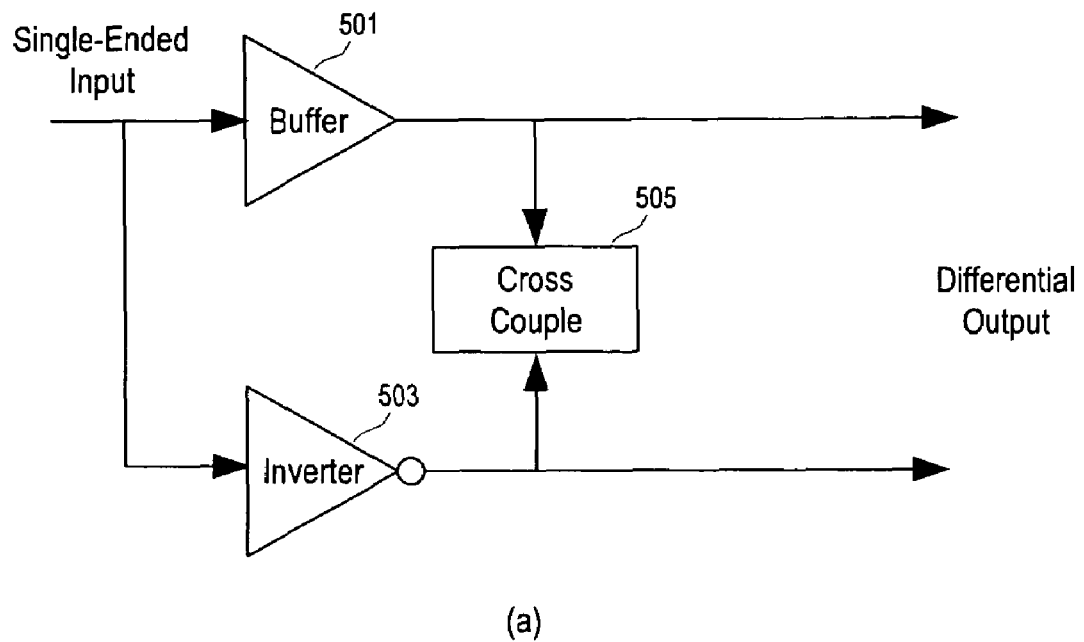
Figure 5:
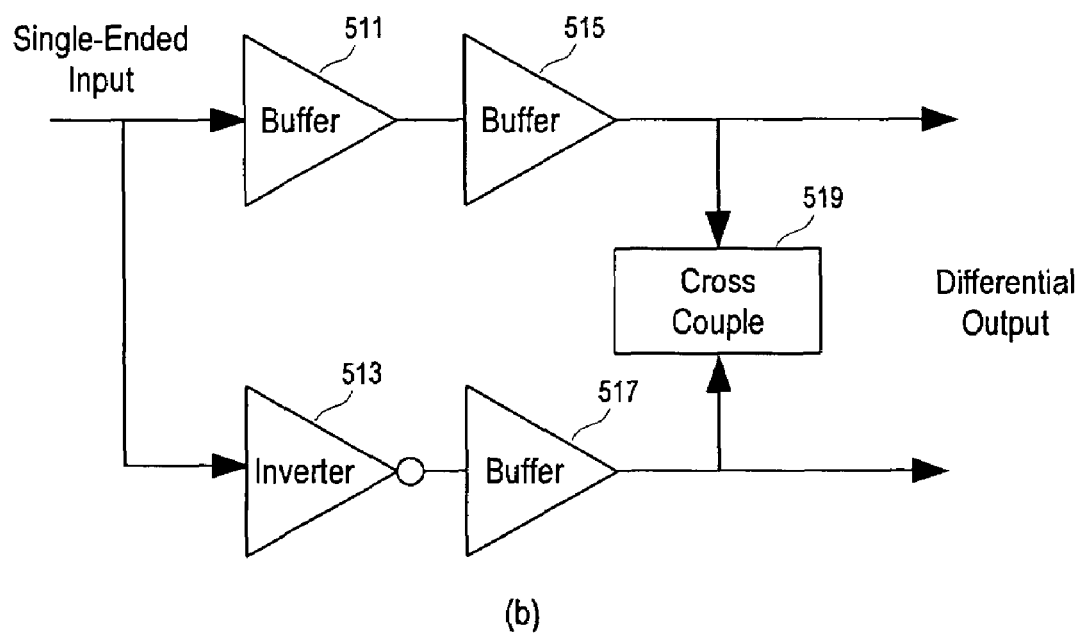

In FIG. 5(a), the pseudo differential digital logic includes a buffer (501) and an inverter (503) to convert a single-ended input into a pair of digital outputs along two paths. A cross-coupled logic block (505) is used to cross couple the output of the buffer (501) and the output of the inverter (503) so that the differential output of opposite polarity is generated. For example, the cross couple logic block (505) can be implemented using a pair of inverters connected in opposite direction, in a way as the inverters (305 and 307) in FIG. 3. The differential output can be further elevated in magnitude using a pair of buffers or inverters (not shown in FIG. 5) along the two paths.

In FIG. 5(b), the pseudo differential digital logic includes: i) two buffers (511 and 515) to generate a digital output along one path; and, ii) an inventor (513) and a buffer (517) to generate another digital output along another path. A cross couple logic block (519) is used to cross couple to the output of the two paths so that the outputs have opposite polarity in a way similar as the cross couple logic block (505) in FIG. 5(a).

In FIG. 5(b), the buffer (517) follows the inverter (513) on the path. Alternatively, a buffer may be placed before an inverter on the path.

Figure 6:
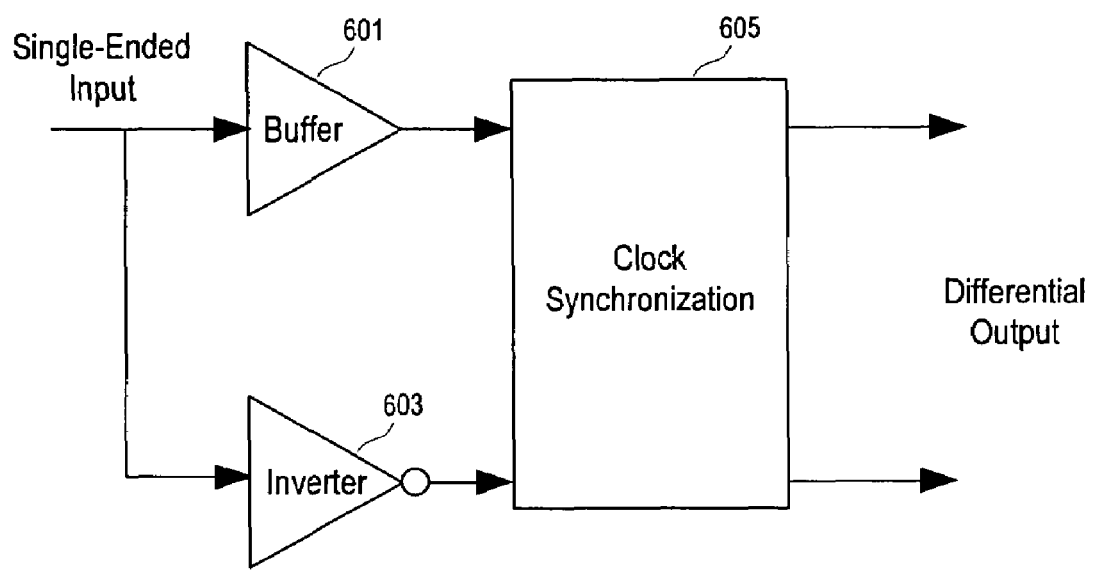

In FIG. 6, the pseudo differential digital logic includes two paths to generate two digital outputs and a clock synchronization logic block (605) is coupled between the two digital outputs to synchronize the clock of the digital outputs and to generate the differential digital output.

In FIG. 6, a buffer (610) and an inverter (603) are used along the two paths to generate the corresponding outputs that are the inputs to the clock synchronization circuit. Alternatively, a string of a combination of buffer(s) and/or inverter(s) can be used on each of the two paths to generate the differential output.

When the fabrication process scales down, the voltage supply of the transistors also comes down. The power consumption of CML circuit is proportional to VI, where V is the voltage supply and I the operating (bias) current. The power consumption of CMOS PDL circuit is proportional to $CV^2f$, where C is the loading capacitance, V the voltage supply, and f the operating frequency.

Since the power consumption of CML circuit is a linear function of the voltage supply V while the power consumption of CMOS digital logic circuit is a square function of the voltage supply V, the power consumption of CMOS digital logic circuit scales down much faster than that of CML circuit as the voltage supply V scales down.

Thus, when advanced fabrication process (e.g., 0.13 micron or smaller) is used, for example, 0.13 um or beyond, a CMOS PDL circuit consumes less power than a CML circuit.

Further more, the power consumption of a CML circuit is a function of voltage supply V and operating current I, but not a function of the operating frequency f. Thus, the power consumption of a CML circuit is independent of the nominal frequency of the signal and the data transfer pattern. Thus, a CML circuitry is typically designed to maintain full power and run at the highest possible frequency of the system for the data transfer performance.

On the other hand, the power consumption of the CMOS PDL circuit is proportional to the operating frequency f. When the operating frequency f is low, the circuitry consumes less power. In applications such as AMB where no special coding (8B/10B) is used to maintain high transition rate and DC balance, it is highly possible that there is no transition for a long period of time in which the working frequency f is 0. Since the working frequency f changes from time to time, a CMOS PDL based circuit may consume less low power statistically.

In one embodiment of the invention, an adaptive power-supply regulator is used to further reduce the power consumption of the transceiver. The power-supply regulator adaptively may adjust the power supply of the transceiver according to the working frequency, data transition pattern, fabrication process and working temperature variations.

For example, when the process hits slow or temperature becomes high, the speed of the device may slow down. In one embodiment, the speed of a device is monitored and compared to a target speed, which is typically determined by the working frequency of the device. The difference in the speed is used in the power supply regulator to increase the power supply and thus to increase the speed of device to the target speed. The power supply regulator can be used to keep the speed performance of the device independent of process and temperature by changing the power supply voltage.

The adaptive power-supply regulator not only reduces power consumption of the transceiver but also functions as a power-supply filter to reduce the power-supply noises.

In one embodiment, the adaptive power-supply regulator includes a Phase-Locked Loop (PLL) and a bias generator. The Phase-Locked Loop includes a phase detector (PD) (211), a loop filter (LF) (213), a voltage controlled oscillator (VCO) (217) and a frequency divider (215).

In one embodiment, the VCO of the Phase-Locked Loop (PLL) of the adaptive power-supply regulator is the same as the VCO of the clock recovery of the transceiver. In one embodiment, the VCO is implemented using CMOS logic circuits. In one embodiment, the adaptive power-supply regulator and the transceiver share the same VCO.

In one embodiment, the working frequency of the VCO in the adaptive power-supply regulator is designed to track the working frequency of the transceiver logic circuits (e.g., the highest working frequency) to optimize the power supply of the transceiver so that no extra power is wasted. Thus, the transceiver uses less power than a corresponding CML implementation.

Alternatively, Phase-Locked Loop (PLL) in the adaptive power-supply regulator can be replaced with a Delay Locked Loop (DLL).

The adaptive power-supply regulator may use a design known in the field. For example, an adaptive power-supply regulator described by J. Kim and M. A. Horowitz in "Adaptive supply serial links with sub-1V operation and per-pin clock recovery, IEEE International Solid-State Circuits Conference, vol. XLV, pp. 268-269, February 2002, can be used with embodiments of the invention.

A current mode logic (CML) costs more die area than digital logic but has better noise performance. Digital logic can achieve similar speed performance in deep-sub micron process. The power consumption of a digital logic is data pattern dependent, such that it consumes almost no power if there is no data activity. The current mode logic uses the same power regardless whether there is data activity or not. A general digital logic has bad noise performance. At least one embodiment of the invention uses the pseudo-differential design and the regulated power supply to improve the noise performance.

Figure 7:
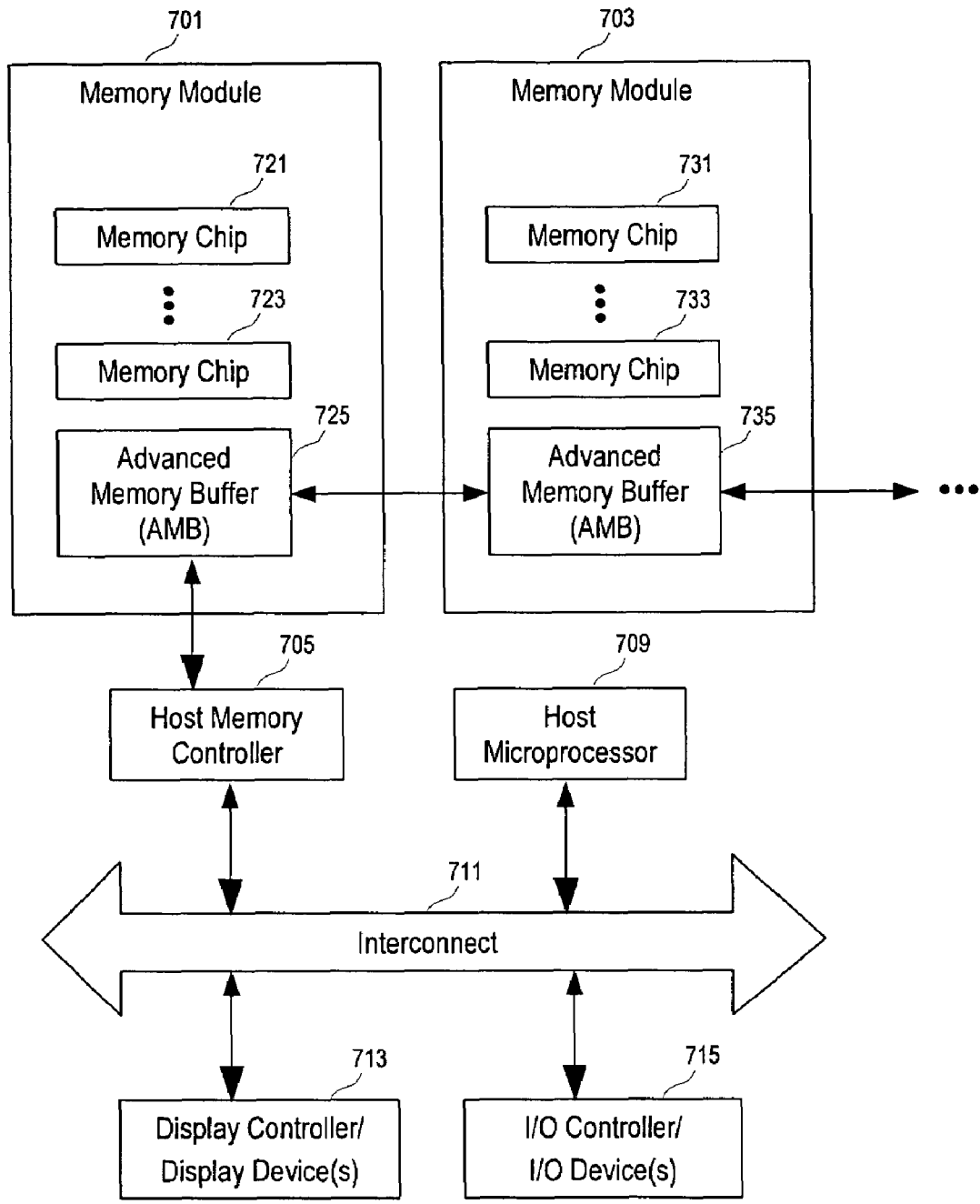
FIG. 7 shows a system in which transceivers according to one embodiment of the invention can be used.

FIG. 7 shows a system in which transceivers according to one embodiment of the invention can be used.

In FIG. 7, a system includes a number of memory modules (701, 703, . . . ). Each of the memory modules includes a number of memory chips. For example, the memory module (701) has memory chips (721, . . . , 723); and the memory module (703) has memory chips (731, . . . , 733).

In FIG. 7, the memory module (701) has an advanced memory buffer (725) which includes the pseudo differential logic implementation and/or adaptive power-supply regulator according to embodiments of the invention.

The transceivers according to embodiments of the invention can also be used in the advanced memory buffer (735).

Each of the memory modules is typically implemented on a single printed circuit board.

In FIG. 7, the host memory controller (705) is coupled to the memory module (701) using a point-to-point link, and the memory module (701) is coupled to the memory module (703) using a point-to-point link. The host microprocessor (709) and the host memory controller (705) are typically on different Integrated Circuit chips, although they may be implemented on the same chip. The host memory controller (705) is coupled to the host microprocessor (709) through an interconnect (711), which may include a bus, a core logic, a high speed serial/parallel link, etc. The display controller/display device(s) (713) and the I/O controllers/I/O device(s) (715) are also coupled to the host microprocessor (709) through the interconnect (711).

In general, a transceiver according to embodiments of the invention can be used in various components of the system in FIG. 7 where high speed data transfer is required, such as in the host microprocessor (709) for communicating with the host memory controller (705), and/or in the host memory controller (705) for communicating with the host microprocessor (705), and/or in the display controller for communicating with the host microprocessor (709), and/or in I/O controller for high speed networking, etc.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A signal transceiver, comprising:
a pseudo differential digital logic circuit to convert an input to the transceiver into a differential digital output:
wherein the pseudo differential digital logic circuit is implemented using Complementary Metal-Oxide Semiconductor (CMOS);
wherein the pseudo differential digital logic circuit comprises:

two logic units each of which is one of: a buffer and an inverter; and a common mode feedback (CMFB) circuit coupled to the two logic units, the CMFB circuit to receive outputs of the two logic units and adjust the two logic units according to a common mode detected from the outputs of the two logic units.

2. The signal transceiver of claim 1, further comprising:
an adaptive power-supply regulator coupled with the pseudo differential digital logic circuit to adaptively adjust a power supply of the pseudo differential digital logic circuit.

3. The signal transceiver of claim 2, wherein the power supply of the pseudo differential digital logic circuit is adjusted according to one of:
an operating frequency of the pseudo differential digital logic circuit;
fabrication process; and
operating temperature variation.

4. The signal transceiver of claim 2, wherein an operating frequency of the adaptive power-supply regulator is configured to track an operating frequency of the pseudo differential digital logic circuit.

5. The signal transceiver of claim 1, wherein the signal transceiver is capable of receiving data at a speed higher than one Gigabit per second.

6. The signal transceiver of claim 1, further comprising:
a de-multiplexer coupled with the pseudo differential digital logic circuit to generate parallel output data according to data time multiplexed in the input.

7. The signal transceiver of claim 1, wherein the input is a single-ended input.

8. A signal transceiver comprising:
a pseudo differential digital logic circuit to convert an input to the transceiver into a differential digital output;
wherein the pseudo differential digital logic circuit is implemented using Complementary Metal-Oxide Semiconductor (CMOS);
wherein the pseudo differential digital logic circuit comprises:
two logic units each of which is one of: a buffer and an inverter; and
a cross couple circuit coupled to the two logic units, the cross couple circuit to cross couple outputs of the two logic units to maintain opposite polarity in the outputs of the two logic units.

9. The signal transceiver of claim 8, wherein the cross couple circuit comprises a first inverter connecting the outputs of the two logic units in a first direction and a second inverter connecting the outputs of the two logic units in a second direction that is opposite to the first direction.

10. The signal transceiver of claim 8, further comprising:
a de-multiplexer coupled with the pseudo differential digital logic circuit to generate parallel output data according to data time multiplexed in the input.

11. The signal transceiver of claim 8, wherein the input is a single-ended input.

12. The signal transceiver of claim 8, further comprising:
an adaptive power-supply regulator coupled with the pseudo differential digital logic circuit to adaptively adjust a power supply of the pseudo differential digital logic circuit.

13. The signal transceiver of claim 12, wherein the power supply of the pseudo differential digital logic circuit is adjusted according to one of:
an operating frequency of the pseudo differential digital logic circuit;
fabrication process; and
operating temperature variation.

14. The signal transceiver of claim 12, wherein an operating frequency of the adaptive power-supply regulator is configured to track an operating frequency of the pseudo differential digital logic circuit.

15. An advanced memory buffer (AMB), comprising:
a first port to a serial data link;
a second port to a parallel data link;
a transceiver coupled with the first port and the second port, the transceiver comprising:
a pseudo differential digital logic circuit implemented in Complementary Metal-Oxide Semiconductor (CMOS), the pseudo differential digital logic circuit to receive input from the first port;
an adaptive power-supply regulator coupled with the pseudo differential digital logic circuit, the adaptive power-supply regulator to adjust a power supply to the pseudo differential digital logic circuit according to an operating condition of the pseudo differential digital logic circuit; and
a de-multiplexer coupled with the second port to drive the parallel data link according to the output of the pseudo differential digital logic circuit.

16. The advanced memory buffer of claim 15, wherein the advanced memory buffer is implemented on a single chip having a feature size less than 0.18 micron;
the pseudo differential digital logic circuit is capable to receive data at a speed higher than one Gigabit per second.

17. The advanced memory buffer of claim 15, wherein an operating frequency of the adaptive power-supply regulator is to track an operating frequency of the pseudo differential digital logic circuit.

18. A system, comprising:
a plurality of memory chips; and
a first advanced memory buffer chip coupled to the plurality of memory chips, the first advanced memory buffer chip implemented in Complementary Metal-Oxide Semiconductor (CMOS), the first advanced memory buffer chip comprising:
a parallel data port connected to the plurality of memory chips;
a serial data port to one of:
a second advanced memory buffer; and
a host memory controller;
a pseudo differential digital logic to convert an input from the serial data port to a differential output; and
an adaptive power-supply regulator coupled with the pseudo differential digital logic circuit, the adaptive power-supply regulator to adjust a power supply to the pseudo differential digital logic circuit according to an operating condition of the pseudo differential digital logic circuit.

19. The system of claim 18, wherein the system comprises a single memory module.

20. The system of claim 18, further comprising:
a processor; and
a memory controller coupled with the processor, the processor to access memory provided by the plurality of memory chips through the memory controller and the first advanced memory buffer chip.

* * * * *